(12) United States Patent
Lin et al.

(10) Patent No.: US 7,221,201 B2
(45) Date of Patent: May 22, 2007

(54) FAST-LOCKING DIGITAL PHASE LOCKED LOOP

(75) Inventors: Feng Lin, Boise, ID (US); Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 43 days.

(21) Appl. No.: 10/915,774

(22) Filed: Aug. 11, 2004

(65) Prior Publication Data
US 2006/0033542 A1 Feb. 16, 2006

(51) Int. Cl.
*H03L 7/06* (2006.01)
(52) U.S. Cl. .................... 327/158; 327/161
(58) Field of Classification Search ............ None
See application file for complete search history.

(56) References Cited

U.S. PATENT DOCUMENTS

| | | | | |
|---|---|---|---|---|
| 5,276,712 A * | 1/1994 | Pearson | ................ | 375/376 |
| 6,373,913 B1 * | 4/2002 | Lee | ................ | 375/376 |
| 6,396,322 B1 * | 5/2002 | Kim et al. | ................ | 327/158 |
| 6,642,800 B2 * | 11/2003 | Drapkin et al. | ................ | 331/16 |
| 6,864,734 B2 * | 3/2005 | Okamura | ................ | 327/291 |
| 6,933,791 B2 * | 8/2005 | Chen | ................ | 331/45 |
| 6,995,554 B2 * | 2/2006 | Loke et al. | ................ | 324/76.54 |
| 2004/0027181 A1 * | 2/2004 | Watanabe | ................ | 327/156 |
| 2004/0061558 A1 * | 4/2004 | Hayashida et al. | ................ | 331/11 |
| 2005/0134337 A1 * | 6/2005 | Lee et al. | ................ | 327/158 |

* cited by examiner

*Primary Examiner*—My-Trang Nu Ton
*Assistant Examiner*—Cassandra Cox
(74) *Attorney, Agent, or Firm*—Fletcher Yoder

(57) ABSTRACT

A method and apparatus for synchronizing signals. For devices, such as memory devices, implementing a synchronization device to synchronize signals, a synchronization device having a delay locked loop coupled to a phase locked loop may be implemented. The delay locked loop is implemented to measure the period of a reference signal and to mirror the period into a second delay line such that an adjusted reference signal having a frequency approximately equal to the frequency of the reference clock may be generated. The adjusted reference signal is delivered to an oscillator such that the oscillator begins oscillating at approximately the same frequency as the reference clock signal to provide a fast locking synchronization device.

14 Claims, 4 Drawing Sheets

FAST-LOCKING DIGITAL PHASE LOCKED LOOP

BACKGROUND OF THE INVENTION

1. Field of the Invention

The present invention relates generally to synchronization devices and, more particularly, to reducing the lock time of devices implementing a phase locked loop to synchronize input signals.

2. Description of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

During high frequency operation, it is often desirable to synchronize the timing of certain signals, such as clock signals, with other clock signals or data signals. Various synchronization devices may be implemented to provide an output signal that is matched in terms of phase and/or frequency to an input signal, which may be an external clock signal, for example. Synchronization devices may, for example, be implemented to synchronize an external system clock with data being transmitted from a memory device.

One means of synchronizing signals is by implementing a delay locked loop (DLL) circuit. The DLL circuit is used to create an output signal that is phase-matched to the input signal. In conventional DLL circuits, an input buffer is used to receive an input signal, such as an external clock signal, and to transmit the signal to one or more delay lines. The delay line includes a number of delay elements. A phase detector may be used to compare the input clock signal to the output signal by using a feedback loop. The information can then be fed from the phase detector to a shift register to move through the delay elements in the delay line incrementally to search for a match. When the input signal and output signal are equal or "matched", the signals are synchronized, and the DLL is considered locked. As can be appreciated, the output signal inherently has the same frequency as the input clock signal.

While DLLs may be desirable for pure delay compensation or clock conditioning applications based on the unconditional stability of the DLL architecture, for other applications, such as frequency synthesis, other delay devices may be desirable. One such device is the phase locked loop (PLL). The fundamental difference between the PLL and the DLL is that instead of a delay line, the PLL implements a voltage controlled oscillator (VCO) to generate a clock signal that approximates an input clock signal. In addition to providing a mechanism for phase adjustment, as with the DLL, the PLL provides a mechanism for frequency adjustment and matching.

Generally, a PLL is a synchronization device which implements a voltage-controlled oscillator (VCO). The VCO is constantly adjusted under the control of a phase detector to match the phase and frequency of an input signal. In addition to stabilizing a particular communications channel (i.e., maintaining the frequency), a PLL may be implemented to generate a signal, modulate or demodulate a signal, reconstitute a signal with less noise, or multiply/divide a frequency. PLLs are often used in wireless communication, particularly where signals are carried using frequency modulation (FM) or phase modulation (PM). PLLs are more commonly used for digital data transmission, but can also be designed for analog information.

Specifically, a PLL includes a VCO that is tuned using a varactor. The PLL includes a phase/frequency detector which causes the VCO to seek and lock onto the desired frequency, based on the output of a crystal-controlled reference oscillator. As with the DLL, the PLL is implemented through a feedback scheme. If the VCO frequency departs from the selected crystal reference frequency, the phase comparator produces an error voltage that is applied to the varactor, bringing the VCO back to the reference frequency. The PLL, VCO, reference oscillator and phase comparator form a frequency synthesizer.

Disadvantageously, using a PLL to synchronize signals often requires several hundred clock cycles to lock both the phase and frequency of a reference signal. By delaying the signal lock, system performance may be degraded. Thus, it would be desirable to provide a synchronization device that locks both phase and frequency in a minimum number of clock cycles.

Embodiments of the present invention may address one or more of the problems set forth above.

BRIEF DESCRIPTION OF THE DRAWINGS

Advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation may be described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
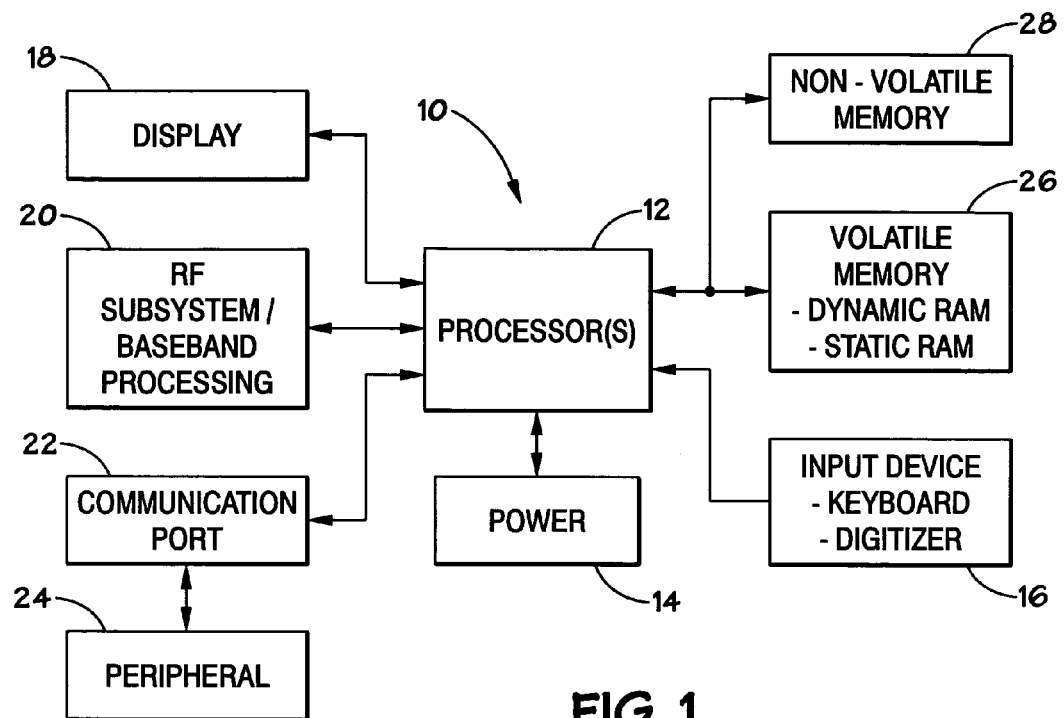
FIG. 1 illustrates a block diagram of an exemplary processor-based device which may incorporate the present technique.

Turning now to the drawings, and referring initially to FIG. 1, a block diagram depicting an exemplary processor-based device, generally designated by the reference numeral 10, is illustrated. The device 10 may be any of a variety of different types, such as a computer, pager, cellular telephone, personal organizer, control circuit, etc. In a typical processor-based device, a processor 12, such as a microprocessor, controls many of the functions of the device 10.

The device 10 typically includes a power supply 14. For instance, if the device 10 is portable, the power supply 14 would advantageously include permanent batteries, replaceable batteries, and/or rechargeable batteries. The power supply 14 may also include an A/C adapter, so that the device may be plugged into a wall outlet, for instance. In fact, the power supply 14 may also include a D/C adapter, so that the device 10 may be plugged into a vehicle's cigarette lighter, for instance.

Various other devices may be coupled to the processor 12, depending upon the functions that the device 10 performs. For instance, a user interface 16 may be coupled to the processor 12. The user interface 16 may include an input device, such as buttons, switches, a keyboard, a light pen, a mouse, and/or a voice recognition system, for instance. A display 18 may also be coupled to the processor 12. The display 18 may include an LCD display, a CRT, LEDs, and/or an audio display. Furthermore, an RF subsystem/baseband processor 20 may also be coupled to the processor 12. The RF subsystem/baseband processor 20 may include an antenna that is coupled to an RF receiver and to an RF transmitter (not shown). A communication port 22 may also be coupled to the processor 12. The communication port 22 may be adapted to be coupled to a peripheral device 24, such as a modem, a printer, or a computer, for instance, or to a network, such as a local area network or the Internet.

Because the processor 12 controls the functioning of the device 10 generally under the control of software programming, memory is coupled to the processor 12 to store and facilitate execution of the software program. For instance, the processor 12 may be coupled to volatile memory 26, which may include dynamic random access memory (DRAM), static random access memory (SRAM), Double Data Rate (DDR) memory, etc. The processor 12 may also be coupled to non-volatile memory 28. The non-volatile memory 28 may include a read only memory (ROM), such as an EPROM or Flash Memory, to be used in conjunction with the volatile memory. The size of the ROM is typically selected to be just large enough to store any necessary operating system, application programs, and fixed data. The volatile memory 26, on the other hand, is typically quite large so that it can store dynamically loaded applications. Additionally, the non-volatile memory 28 may include a high capacity memory such as a disk drive, tape drive memory, CD ROM drive, DVD, read/write CD ROM drive, and/or a floppy disk drive.

As will be appreciated, while synchronization devices such as DLLs may be advantageously implemented in the volatile memory 26, such as an SDRAM, to synchronize data with a reference clock during a read or write operation, for applications where frequency locking is desirable, such synchronization devices may not be ideal. PLLs may be configured for a number of applications, such as frequency multiplication, demodulation, tracking generation or clock recovery, for example, as previously described. With specific reference to the system 10, PLLs may be implemented to reduce jitter, scale the frequency of clock signals to save power or match different frequency clock signals over a wide range of frequencies, for example. PLLs may be useful in the processor 12, the RF subsystem 20 and the volatile memory 26, for example. Advantageously, the exemplary embodiments of the presently described PLL, illustrated with reference to FIGS. 3–5, may be implemented to achieve phase and frequency locking within a reduced number of clock cycles (e.g., two clock cycles, rather than hundreds of clock cycles).

Figure 2:
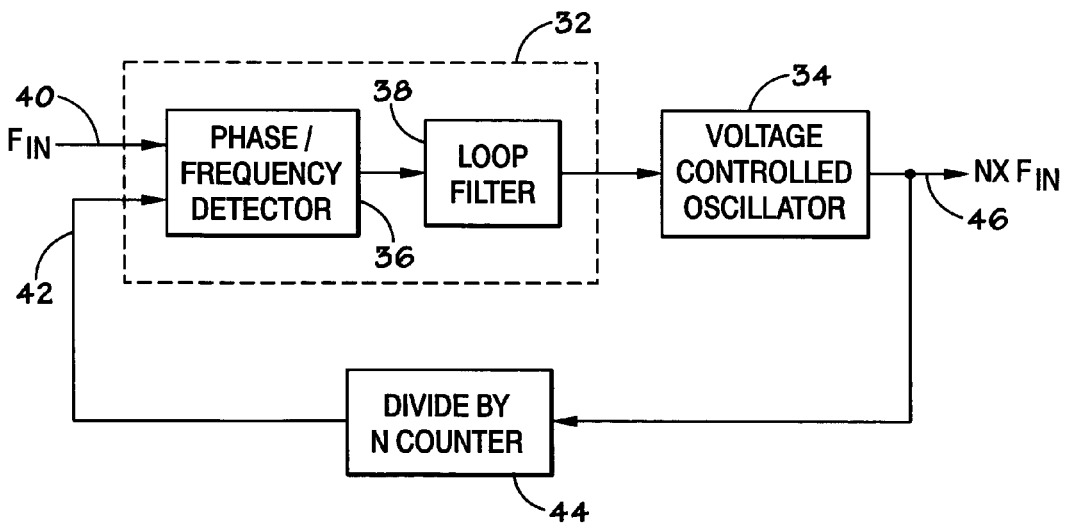
FIG. 2 illustrates a block diagram of a conventional phase locked loop (PLL) used to synchronize the output data with a system clock.

FIG. 2 illustrates a block diagram of a conventional PLL circuit 30 configured as a frequency multiplier. As previously described, the PLL circuit 30 is generally a feedback control system used for frequency control, which includes a control block 32 that controls the phase and frequency of a voltage controlled oscillator (VCO) 34. The control block 32 includes a phase/frequency detector 36 and a loop filter 38. A reference input signal, such as a clock signal, having a frequency $F_{IN}$ is delivered to a first input 40 of the phase/frequency detector 36. The second input 42 of the phase/frequency detector 36 receives the feedback output of a divide-by-N counter 44. The output of the phase/frequency detector 36 is a voltage signal proportional to the phase difference between the signals received at the inputs 40 and 42. The voltage signal from the phase detector 38 is applied to the loop filter 38. As will be appreciated, the loop filter 38 determines the dynamic characteristics of the PLL circuit 30. The output signal from the loop filter 38 controls the VCO 34. The output signal 46 of the VCO 34 has a frequency that is N times the frequency of the reference input 40. The output signal 46 is delivered back to the phase/frequency detector 36 via the divide by N counter 44. Accordingly, the input signals delivered to the inputs 40 and 42 generally have approximately the same frequencies. However, as will be appreciated, the actual locking of the input signals may take many clock cycles to allow the feedback signal to gradually synchronize with the input signal in terms of phase and frequency. It would be advantageous to reduce the period it takes for locking the signals.

Figure 3:
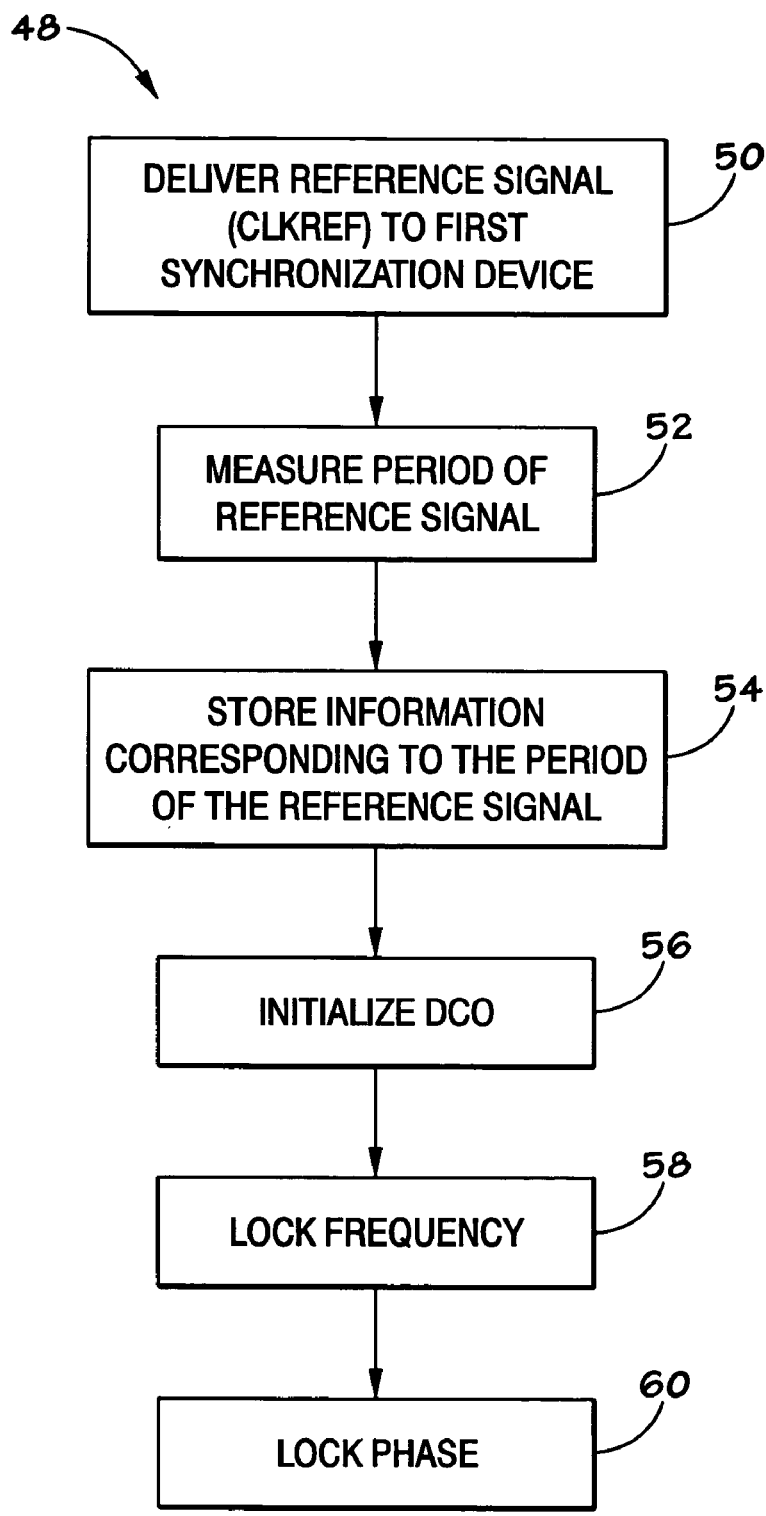
FIG. 3 illustrates a flow chart of an exemplary locking process in accordance with embodiments of the present techniques.

FIG. 3 is a flow chart illustrating an exemplary embodiment of the present techniques for improving locking speed. Exemplary embodiments of synchronization devices for implementing such techniques will be further described with reference to FIGS. 4 and 5 below. Generally speaking, the present techniques incorporate aspects of alternate synchronization devices, such as a Synchronous Mirror Delay (SMD) or a Measure Controlled Delay (MCD), which may be used to measure the period/frequency of a reference signal. By measuring the frequency of the reference signal and storing the reference frequency, an adjusted reference signal having a frequency that is close to that of the reference signal may be delivered to a digitally controlled delay line. In accordance with the disclosed embodiments, the digitally controlled delay line is configured to provide a DCO. The DCO may then be implemented to generate an internal reference signal having a frequency close to that of the reference clock signal. As will be appreciated, only two clock cycles may be necessary to generate the internal reference signal, thereby providing a faster locking mechanism. Once the frequency is locked, a fine adjustment for the DCO is applied to lock the phase.

Turning now to FIG. 3, a flow chart depicting an exemplary embodiment of an improved synchronization process 48 is illustrated. Initially, a reference signal, such as a reference clock signal (CLKREF) is delivered to the synchronization circuit as indicated in block 50. As will be appreciated, the reference signal (CLKREF) has a certain frequency ($f_{CK}$). Next, the frequency or the period of the reference signal (CLKREF) is measured using an MCD circuit or an SMD circuit, for instance, as indicated in block 52. The information corresponding to the period of the reference clock may be stored as digital code, as indicated in block 54. The measurement and storage of the information corresponding to the period of the reference signal (CLKREF) using an MCD or an SMD circuit will be described in greater detail with reference to FIGS. 4 and 5.

Once the period of the reference signal (CLKREF) is measured and the corresponding information is stored, the information is used to enable a DCO such that the DCO is initialized to oscillate at a frequency approximately equal to that of the reference signal (CLKREF), as indicated in block 56. That is to say that the DCO is initialized to oscillate within the time period of one delay element in the delay line (e.g., approximately 100 ps–200 ps). By calculating the period of the reference signal (CLKREF) and using the period to generate an adjusted reference signal having approximately the same frequency as the reference signal (CLKREF), the DCO will begin oscillating at approximately the same frequency as the reference signal (CLKREF). By stabilizing the system and controlling where the DCO begins oscillating (i.e., near the frequency $f_{CK}$ of the reference signal (CLKREF)), the overall lock time is reduced. Once the MCD is implemented to initialize the DCO to begin oscillating, a phase detector takes control of the DCO such that the frequency may be adjusted and locked, as indicated in block 58. Finally, a fine adjustment for the DCO may be applied to lock the phase after the frequency is locked, as indicated in block 60. By measuring the period of the reference signal (CLKREF), it will generally only take two clock cycles to lock the frequency and phase.

Figure 4:
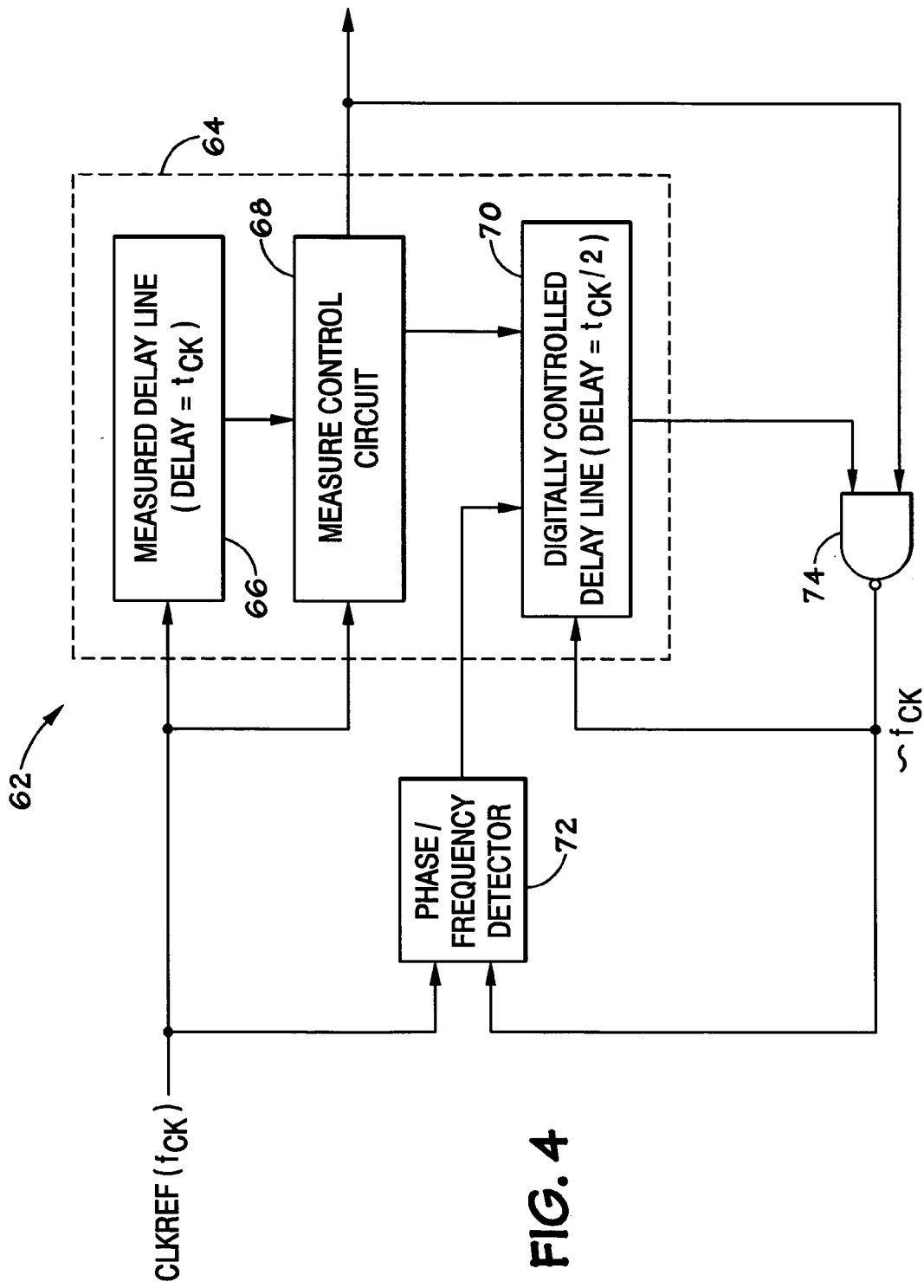
FIG. 4 illustrates a block diagram of an exemplary embodiment of a phase locked loop (PLL) in accordance with the present techniques.

Turning now to FIG. 4, an exemplary embodiment of a synchronization circuit 62 having a feedback control loop is illustrated. The exemplary synchronization circuit 62 implements a measure controlled delay (MCD) circuit 64 to measure and store the period of a reference signal such as the reference clock (CLKREF). The MCD circuit 64 includes a measured delay line 66, a measure control circuit 68, such as a latch, and a second delay line 70. In the present exemplary embodiment, the delay line 70 is a digitally-controlled delay line having a delay equal to half of the delay through the delay line 66, as described further below. The measured delay line 66 has an output tap that allows the measure control circuit 68 to capture the position of the clock edge and thereby store the period and/or frequency of the reference signal (CLKREF) such that the information may be used to set the delay line 70. By setting the delay line 70 to a frequency $f_{CK}$ approximately equal to the frequency of the reference signal (CLKREF), the synchronization circuit 62 will lock faster. As discussed further below, once the period of the reference signal (CLKREF) is measured and stored, the information will be used to initialize the delay line 70, which will be implemented as a DCO.

During operation, the reference signal (CLKREF) propagates as far into the measured delay line 66 as it can before the next clock (the N+1$^{th}$ clock) triggers the measure control circuit 68. The propagation delay through the measured delay line 66 will be equal to one clock cycle ($t_{CK}$). The N+1$^{th}$ clock causes a measurement of the period of the reference signal (CLKREF) to be performed, and the measurement is loaded into the measure control circuit 68. The measure control circuit 68 causes the clock edge to move down into the digitally controlled delay line 70, after which the synchronized output propagates out of the digitally controlled delay line 70. The propagation delay through the digitally controlled delay line 70 is equal to one half of a clock cycle ($t_{CK}/2$), such that the oscillation frequency is approximately equal to $f_{CK}$. It will take relatively few clock cycles, generally two, to capture and hold the period of the reference signal (CLKREF) in the measure control circuit 68. As will be appreciated, the number of delay stages used to lock the MCD circuit 62 may depend on the process, voltage, temperature and frequency (PVTF) characteristics.

Initially, the delay line 70 is controlled by the MCD 64. After initialization, the phase/frequency detector 72 assumes control of the delay line 70. The delay line 70 and the feedback loop through the phase/frequency detector 72 are arranged to form a DCO. As previously described, the DCO will begin to oscillate at a frequency approximately equal to the frequency ($f_{CK}$) of the reference signal (CLKREF). The adjusted reference signal may also be synchronized with the reference signal (CLKREF) through the NAND gate 74 to reduce the initial phase error of the DCO. Once the DCO receives the internal reference signal and starts oscillating at approximately the frequency ($f_{CK}$) of the reference signal (CLKREF), the phase/frequency detector 72 is implemented such that the frequency of the DCO may be adjusted and locked. Finally, the phase/frequency detector 72 provides a fine adjustment to lock the phase of the DCO after the frequency is locked.

As will be appreciated, an SMD circuit (not shown) may be implemented in place of the MCD circuit 64. The SMD includes a forward delay array comprising a delay line having an output tap at every stage of the delay line. The output tap configuration of the forward delay array allows a controller to cause the clock edge to drop down into a second delay line also having an input tap at every stage. The operation of an SMD circuit is also triggered by the N+1$^{th}$ clock and the forward delay line may be implemented as a DCO after initialization. As with the MCD circuit 64, an SMD circuit may advantageously lock in approximately two clock cycles, depending on the process, voltage, temperature and frequency (PVTF) characteristics.

Figure 5:
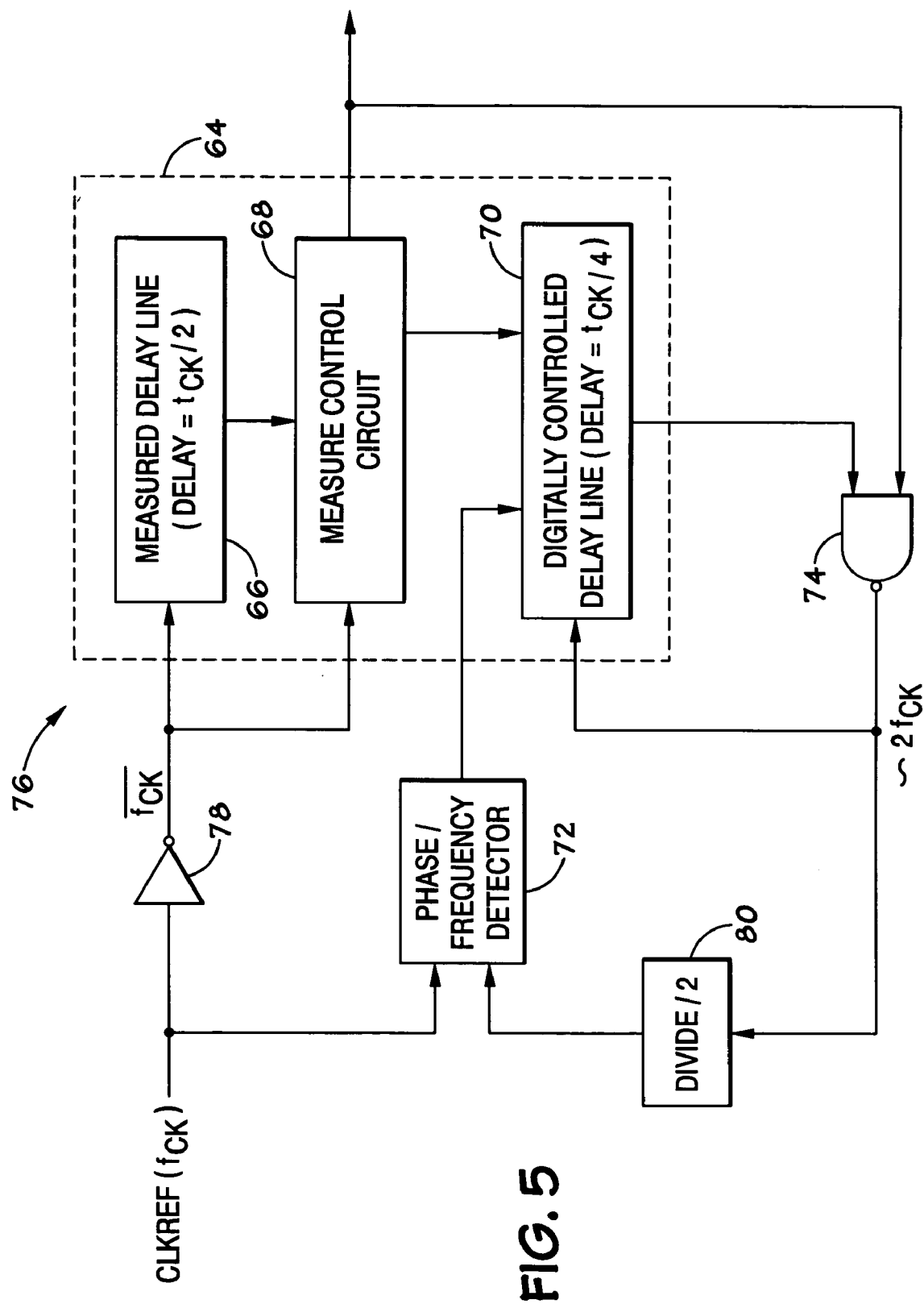
FIG. 5 illustrates a block diagram of an alternate exemplary embodiment of a phase locked loop (PLL) in accordance with the present techniques.

FIG. 5 illustrates an alternate exemplary embodiment of a synchronization circuit 76 in accordance with the present techniques. As previously described with reference to the synchronization circuit 62 of FIG. 4, the synchronization circuit 76 also implements a measure controlled delay (MCD) circuit 64, including a measured delay line 66, a measure control circuit 68, such as a latch, and a second delay line 70, to provide an adjusted reference signal having a frequency approximately equal to the frequency of the reference signal (CLKREF) to the digitally controlled oscillator DCO. For clarity, like reference numerals have been used to illustrate elements previously described. The embodiment differs from the embodiment described with reference to FIG. 4 such that in the exemplary embodiment illustrated in FIG. 5, the MCD 64 is locked to half of the period $t_{CK}$ (i.e., $t_{MCD}=\frac{1}{2}t_{CK}$). As will be appreciated, this embodiment may not provide as much initial accuracy in generating the internal reference signal. However, the delay lines 66 and 70 may be implemented with fewer elements.

During operation, the inverse of the reference signal (CLKREF) (having a frequency equal to $\overline{f_{CK}}$) propagates as far into the measured delay line 66 as it can before the next clock (the N+1$^{th}$ clock) triggers the measure control circuit 68. The reference signal (CLKREF) is inverted through the inverter 78. The propagation delay through the measured delay line 66 will be equal to one half of a clock cycle ($t_{CK}/2$). The N+1$^{th}$ clock causes a measurement of the period of the reference signal (CLKREF) to be performed, and the measurement is loaded into the measure control circuit 68. The measure control circuit 68 causes the clock edge to move down into the digitally controlled delay line 70, after which the adjusted reference signal propagates out of the digitally controlled delay line 70. The propagation delay through the digitally controlled delay line 70 will be equal to one quarter of a clock cycle ($t_{CK}/4$). As with the embodiment of FIG. 4, it will take relatively few clock cycles, generally two, to capture and hold the period of the reference signal (CLKREF) in the measure control circuit 68. As will be appreciated, the number of delay stages used to lock the MCD circuit 76 may depend on the process, voltage, temperature and frequency (PVTF) characteristics.

In the present exemplary embodiment, the internal reference signal has a frequency approximately equal to twice that of the frequency ($2f_{CK}$) of the reference signal (CLKREF). The internal reference signal is delivered to the delay line 70 such that the DCO 66 begins oscillating at the frequency ($2f_{CK}$), since the propagation delay through the digitally controlled delay line 70 will be equal to one quarter of a clock cycle ($t_{CK}$ / 4). The internal reference signal may also be synchronized with the reference signal (CLKREF) through the NAND gate 74 to reduce the initial phase error of the DCO. Once the DCO receives the internal reference signal (JNTCLKLREF) and starts oscillating at approximately twice the frequency ($f_{CK}$) of the reference signal (CLKREF), the phase/frequency detector 72 is implemented such that the frequency of the DCO may be adjusted and locked. To provide proper matching through the phase/frequency detector 72, a divide-by-two circuit 80 is also provided in the feedback path. Finally, the phase/frequency detector 72 provides a fine adjustment to lock the phase of the DCO after the frequency is locked. As will be appreciated, an SMD circuit (not shown) may be implemented in place of the MCD circuit 64 in the present exemplary embodiment.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of synchronizing signals in a device comprising:
    measuring a period of a reference signal having a reference frequency and a reference phase;
    generating an adjusted reference signal having a frequency approximately equal to the reference frequency, wherein the adjusted reference signal is generated internal to the device;
    delivering the adjusted reference signal to an oscillator, wherein delivering comprises delivering the adjusted reference signal to a digitally controlled oscillator (DCO) through a feedback loop;
    locking a frequency of an output signal of the synchronization device with the frequency of the reference signal; and
    locking a phase of the output signal of the synchronization device with the phase of the reference signal.

2. The method, as set forth in claim 1, wherein measuring comprises measuring the period of a clock signal.

3. The method, as set forth in claim 1, wherein measuring comprises measuring the period using a delay line.

4. The method, as set forth in claim 1, wherein generating comprises generating an internal reference signal using a measure controlled delay (MCD) device.

5. The method, as set forth in claim 1, wherein generating comprises generating an internal reference signal using a synchronous mirror delay (SMD) device.

6. The method, as set forth in claim 1, wherein generating comprises storing the measured period and setting a delay line to a delay equal to one half of the measured period.

7. The method, as set forth in claim 1, wherein delivering comprises delivering the adjusted reference signal to the oscillator such that the oscillator begins oscillating at approximately the reference frequency.

8. The method, as set forth in claim 1, wherein locking the frequency and the phase of the output signal with the frequency and phase of the reference signal comprises implementing a phase detector.

9. A method of synchronizing signals in a device comprising:
    measuring a period of a reference signal having a reference frequency and a reference phase;
    generating an adjusted reference signal having a frequency approximately equal to the reference frequency, wherein the adjusted reference signal is generated internal to the device;
    delivering the adjusted reference signal to an oscillator;
    locking a frequency of an output signal of the synchronization device with the frequency of the reference signal; and
    locking a phase of the output signal of the synchronization device with the phase of the reference signal,
    wherein measuring and generating are performed in two periods.

10. A method comprising:
    delivering a reference signal to a first delay line, wherein the reference signal comprises a reference period;
    measuring the reference period in the first delay line;
    storing the measured reference period;
    setting a second delay line to approximately equal to the reference period using a control circuit;
    delivering an adjusted reference signal from the second delay line to the second delay line through a feedback loop; and
    locking the adjusted reference signal to the reference signal.

11. The method, as set forth in claim 10, wherein delivering the reference signal comprises delivering a clock signal.

12. The method, as set forth in claim 10, wherein delivering the adjusted reference signal comprises delivering the adjusted reference signal to the second delay line such that the second delay line begins oscillating at a frequency approximately equal to the inverse of the reference period.

13. The method, as set forth in claim 10, wherein delivering the adjusted reference signal comprises delivering the adjusted reference signal to a digitally controlled delay line.

14. The method, as set forth in claim 10, wherein locking comprises implementing a phase detector.

* * * * *